United States Patent
Guo et al.

(10) Patent No.: US 10,535,773 B2
(45) Date of Patent: Jan. 14, 2020

(54) FINFET WITH SIGMA RECESSED SOURCE/DRAIN AND UN-DOPED BUFFER LAYER EPITAXY FOR UNIFORM JUNCTION FORMATION

(71) Applicant: International Business Machines Corporation, Armonk, NY (US)

(72) Inventors: Dechao Guo, Niskayuna, NY (US); Hemanth Jagannathan, Niskayuna, NY (US); Shogo Mochizuki, Clifton Park, NY (US); Gen Tsutsui, Glenmont, NY (US); Chun-Chen Yeh, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/234,985

(22) Filed: Dec. 28, 2018

(65) Prior Publication Data

US 2019/0157457 A1    May 23, 2019

Related U.S. Application Data

(60) Division of application No. 15/808,405, filed on Nov. 9, 2017, now Pat. No. 10,249,758, which is a continuation of application No. 15/619,923, filed on Jun. 12, 2017, now Pat. No. 10,096,713.

(51) Int. Cl.
*H01L 29/78* (2006.01)
*H01L 29/08* (2006.01)
(Continued)

(52) U.S. Cl.
CPC ...... *H01L 29/7851* (2013.01); *H01L 21/0245* (2013.01); *H01L 21/0257* (2013.01);
(Continued)

(58) Field of Classification Search
CPC .................. H01L 29/7848; H01L 29/66636
See application file for complete search history.

(56) References Cited

U.S. PATENT DOCUMENTS 7,951,657 B2   5/2011   Cheng et al.
8,525,186 B2   9/2013   Cheng et al.
(Continued)

OTHER PUBLICATIONS

List of IBM Patents or Patent Applications Treated as Related, dated Dec. 28, 2018, 2 pages.

*Primary Examiner* — Thomas L Dickey
(74) *Attorney, Agent, or Firm* — Scully, Scott, Murphy & Presser, P.C.; L. Jeffrey Kelly, Esq.

(57) ABSTRACT

After forming a gate structure over a semiconductor fin that extends upwards from a semiconductor substrate portion, a sigma cavity is formed within the semiconductor fin on each side of the gate structure. A semiconductor buffer region composed of an un-doped stress-generating semiconductor material is epitaxially growing from faceted surfaces of the sigma cavity. Finally, a doped semiconductor region composed of a doped stress-generating semiconductor material is formed on the semiconductor buffer region to completely fill the sigma cavity. The doped semiconductor region is formed to have substantially vertical sidewalls for formation of a uniform source/drain junction profile.

11 Claims, 12 Drawing Sheets

(51) Int. Cl.
*H01L 29/165* (2006.01)
*H01L 29/66* (2006.01)
*H01L 21/02* (2006.01)

(52) U.S. Cl.
CPC .. *H01L 21/02381* (2013.01); *H01L 21/02433* (2013.01); *H01L 21/02532* (2013.01); *H01L 21/02636* (2013.01); *H01L 21/02639* (2013.01); *H01L 29/0847* (2013.01); *H01L 29/165* (2013.01); *H01L 29/66636* (2013.01); *H01L 29/66795* (2013.01); *H01L 29/7848* (2013.01)

(56) References Cited

U.S. PATENT DOCUMENTS

| | | |
|---|---|---|
| 8,541,281 B1 | 9/2013 | Kronholz et al. |
| 8,698,243 B2 | 4/2014 | Flachowsky et al. |
| 8,890,245 B2 | 11/2014 | Cheng et al. |
| 8,946,060 B2 | 2/2015 | Cheng et al. |
| 9,006,066 B2 | 4/2015 | Chi et al. |
| 9,034,741 B2 | 5/2015 | Adam et al. |
| 10,249,758 B2 * | 4/2019 | Guo ................. H01L 21/02381 |
| 2013/0244389 A1 | 9/2013 | Cheng et al. |
| 2014/0353732 A1 | 12/2014 | Adam et al. |
| 2014/0367768 A1 | 12/2014 | Lee et al. |
| 2015/0001628 A1 | 1/2015 | LiCausi et al. |
| 2015/0137193 A1 * | 5/2015 | Cheng ................. H01L 29/7842 257/288 |
| 2015/0236157 A1 | 8/2015 | Kwok et al. |
| 2015/0380488 A1 * | 12/2015 | Chou ................. H01L 29/0847 257/347 |
| 2016/0064522 A1 | 3/2016 | Tu |

\* cited by examiner

FINFET WITH SIGMA RECESSED SOURCE/DRAIN AND UN-DOPED BUFFER LAYER EPITAXY FOR UNIFORM JUNCTION FORMATION

BACKGROUND

The present application relates to semiconductor devices, and more particularly, to the formation of uniform source/drain junctions in fin field effect transistors (FinFETs) with sigma-shaped source/drain regions.

Applying stress to the channel of a field effect transistor (FET) is desirable to increase the speed of the device. One way of generating stress in the channel of an FET is to embed a stress-generating material within source and drain (i.e., source/drain) regions of the FET. The embedded structures can be formed by etching portions of the source/drain regions to form cavities, and refilling the cavities with a doped stress-generating material by epitaxy.

Embedding "sigma-shaped" structures in source/drain regions of a FinFET has been approved to be an effective approach for channel strain enhancement. FIG. 1 depicts a prior art structure 100 including a semiconductor fin 110 located on a substrate (not shown), gate structures 120 formed over the semiconductor fin 110, and a sigma-shaped source/drain structure 130 embedded in a sigma cavity 132 between the gate structures 120. The sigma-shaped source/drain structure 130 allows for close proximities towards the transistor channel region 140 and therefore maximizing stress inside the transistor channel region 140. However, for FinFETs, the subsequent drive-in anneal performed on such sigma-shaped source/drain structure 130 results in a non-uniform junction profile 150, along the fin height direction, yielding in gate length variation within each semiconductor fin. Therefore, an embedded source/drain structure and process that provide a uniform source/drain junction profile are needed.

Moreover, to create more stress on the channel, a greater volume of stress-generating material is desired, therefore a sigma cavity with a greater sigma tip depth (d) is needed. However, for FinFETs with narrow gates, forming a sigma cavity with a deeper sigma tip is challenging because of the limitation on the extent of the lateral etch that is used to form the sigma cavity. The excessive lateral etch may cause exposure of the gate material. The sigma tip depth (d) is typically about 10 nm, which is far less than the active fin height (D) (about 35 nm). Therefore, an embedded source/drain structure and process which can maximize volume of the stress-generating material, while providing a uniform source/drain junction profile for narrow gate FinFETs, are needed.

SUMMARY

The present application provides a method of making sigma-shaped embedded source/drain structures with a uniform source/drain junction profile along the fin height direction; moreover, the process also allows creating embedded source/drain structures within multiple sigma cavities to create more stress on a channel region of a narrow gate FET, while maintaining a uniform source/drain junction profile along the fin height direction.

In one aspect of the present application, a semiconductor structure is provided. The semiconductor structure includes a gate structure located over a semiconductor fin that extends upwards from a semiconductor substrate portion. The gate structure includes a gate stack straddling a channel portion of the semiconductor fin and a gate spacer present on sidewalls of the gate stack. A sigma cavity is located within the semiconductor fin on each side of the gate structure. The sigma cavity includes a horizontal tip region extending beneath the gate spacer and a bottom region extending towards the semiconductor substrate portion. A semiconductor buffer region is located on faceted surfaces of the sigma cavity. The semiconductor buffer region completely fills the horizontal tip region and the bottom region of the sigma cavity. A doped semiconductor region is located on the semiconductor buffer region to completely fill the sigma cavity. The doped semiconductor region has substantially vertical sidewalls.

In another aspect of the present application, a method of forming a semiconductor structure is provided. The method includes forming a gate structure over a semiconductor fin that extends upwards from a semiconductor substrate portion. The gate structure includes a gate stack straddling a channel portion of the semiconductor fin and a gate spacer present on sidewalls of the gate stack. A sigma cavity is then formed within the semiconductor fin on each side of the gate structure. The sigma cavity includes a horizontal tip region extending beneath the gate spacer and a bottom region extending towards the semiconductor substrate portion. Next, a semiconductor buffer region is epitaxially grown from faceted surfaces of the sigma cavity to completely fill the horizontal tip region and the bottom region of the sigma cavity. An unfilled portion of the sigma cavity has substantially vertical sidewalls. Next, a doped semiconductor region is epitaxially grown from the semiconductor buffer region. The doped semiconductor region completely fills the unfilled portion of the sigma cavity and has substantially vertical sidewalls.

BRIEF DESCRIPTION OF THE DRAWINGS

FIG. 2A is taken along a direction parallel to a lengthwise direction of the semiconductor fin.

DETAILED DESCRIPTION

Figure 1:
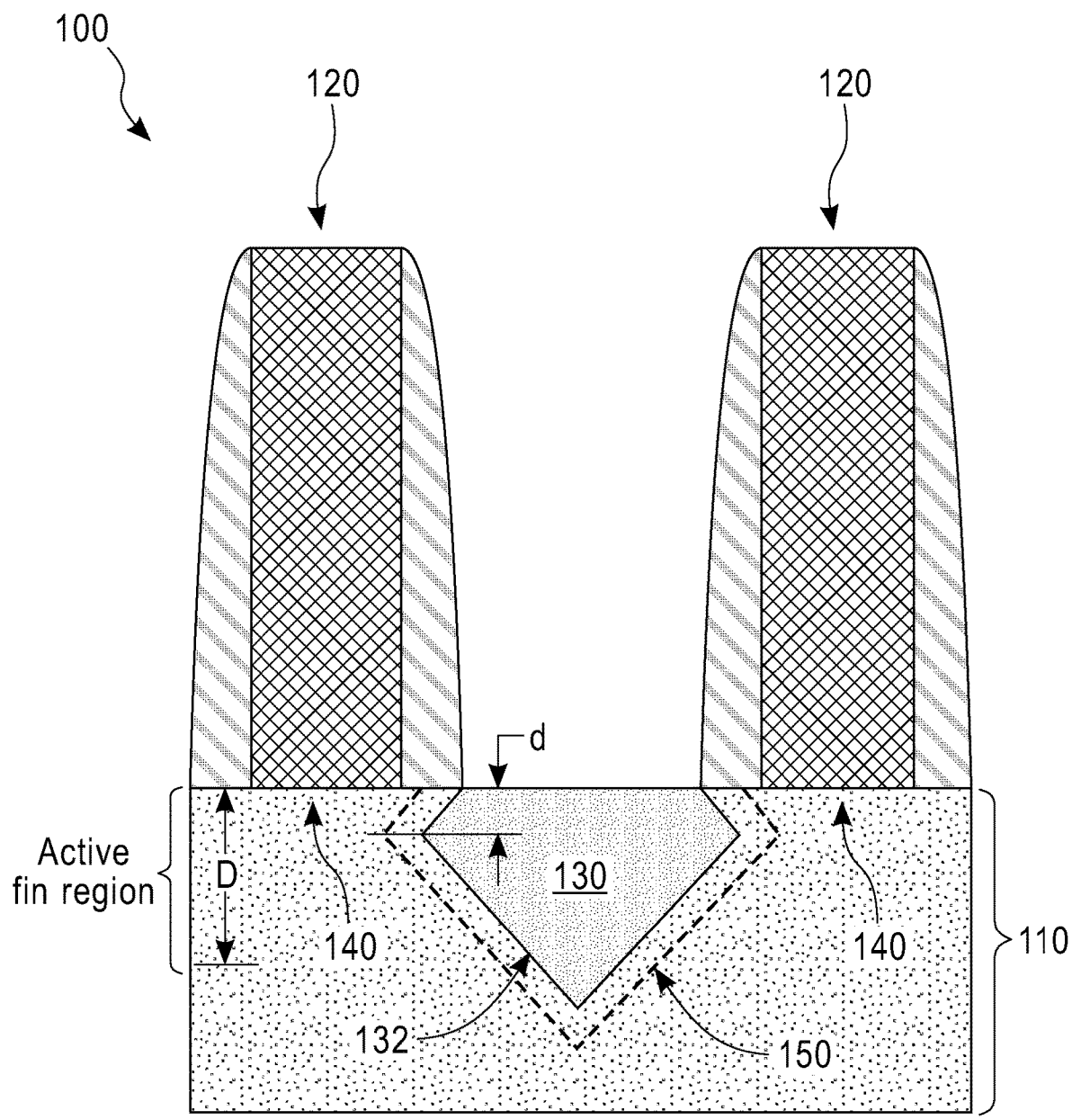
FIG. 1 is a cross-sectional view of a prior art semiconductor structure including a sigma-shaped source/drain structure having a non-uniform source/drain junction profile.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figures 2A, 2B:
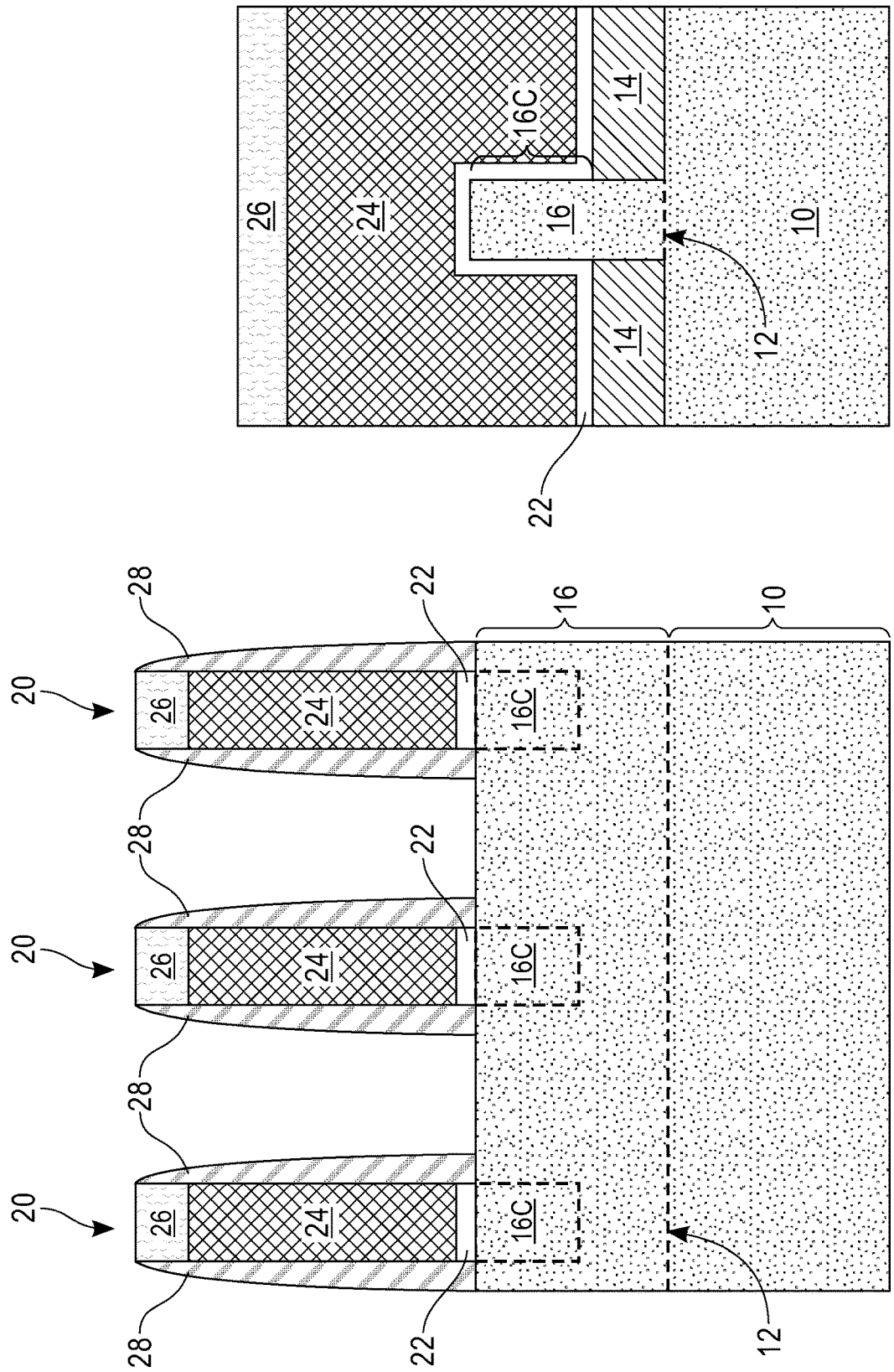
FIG. 2A is a cross-sectional view of a first exemplary semiconductor structure according to a first embodiment of the present application that includes a semiconductor fin extending upwards from a semiconductor substrate portion and gate structures formed over the semiconductor fin.
FIG. 2B is another cross-sectional view of the first exemplary semiconductor structure of FIG. 2A taken along a direction perpendicular to the lengthwise direction of the semiconductor fin.

Referring to FIGS. 2A-2B, there are illustrated a first exemplary semiconductor structure that can be employed according to a first embodiment of the present application. The semiconductor structure includes a semiconductor fin 16 extending upwards from a semiconductor substrate portion 10 and gate structures 20 formed over the semiconductor fin 16. While only a single semiconductor fin 16 is shown, some embodiments may include multiple semiconductor fins formed above the semiconductor substrate portion 10.

The first exemplary semiconductor structure shown in FIGS. 2A-2B can be formed by first providing a semiconductor substrate (not shown). The semiconductor substrate that can be used in the present application is a bulk semiconductor substrate. By "bulk" semiconductor substrate, it is meant a substrate that is entirely composed of at least one semiconductor material having semiconducting properties. In the present application, at least an upper portion of the bulk semiconductor substrate is composed of a semiconductor material including, for example, silicon (Si), germanium (Ge), a silicon germanium (SiGe) alloy, a carbon doped silicon (Si:C) alloy, III-V compound semiconductors or II-VI compound semiconductors. In one embodiment, the semiconductor substrate is composed entirely of silicon.

The at least one semiconductor material that provides the semiconductor substrate may be single crystalline, polycrystalline or amorphous. In one example, the entirety of, or at least the upper portion of, the semiconductor substrate is composed of a single crystalline semiconductor material such as, for example, single crystalline silicon.

The thickness of the semiconductor substrate can be from 30 µm to about 2 mm, although less and greater thicknesses can also be employed.

After providing the semiconductor substrate, the semiconductor substrate is patterned to provide the semiconductor fin 16. In the present application, the semiconductor fin 16 is formed within the upper portion of the semiconductor substrate, while the semiconductor substrate portion 10 represents a remaining lower portion of the semiconductor substrate. A material interface 12 may or may not exist between the semiconductor fin 16 and the semiconductor substrate portion 10. The semiconductor fin 16 may have a circular shape or a rectangular shape. In one embodiment of the present application, the semiconductor fin 16 has a width from 5 nm to 30 nm, although lesser and greater widths can also be employed. The height of the semiconductor fin 16 can be from 30 nm to 200 nm, although lesser and greater heights can also be employed. If multiple fins are formed, each semiconductor fin 16 is spaced apart from its nearest neighboring semiconductor fin 16 by a distance. In one embodiment, the distance between neighboring semiconductor fins 16 can be from 20 nm to 1000 nm. Also, the semiconductor fins 16 are oriented parallel to each other.

The semiconductor fin 16 can be formed by patterning the upper portion of the semiconductor substrate. In one embodiment of the present application, the patterning used to provide the semiconductor fin 16 may include lithography and etching. Lithography includes forming a photoresist layer (not shown) atop the semiconductor substrate. The photoresist layer may include a positive-tone photoresist material, a negative-tone photoresist material or a hybrid-tone photoresist material. The photoresist layer may be formed by a deposition process such as, for example, spin coating. After forming the photoresist layer, the photoresist layer is subjected to a pattern of irradiation. Next, the exposed photoresist layer is developed utilizing a conventional resist developer. This provides a patterned photoresist layer atop the semiconductor substrate to be patterned. The pattern provided by the patterned photoresist layer is thereafter transferred into the underlying semiconductor substrate utilizing at least one pattern transfer etching process. Typically, the at least one pattern transfer etching process is an anisotropic etch. In one embodiment, a dry etch such as, for example, reactive ion etch (RIE) can be used. In another embodiment, a wet etch utilizing chemical etchant can be used. In still a further embodiment, a combination of dry etch and wet etch can be used. In the illustrated embodiment, the etch stops within a portion of the semiconductor substrate.

In another embodiment of the present application, the patterning used to provide semiconductor fin 16 may include a sidewall image transfer (SIT) process. The SIT process includes forming a mandrel material layer (not shown) atop the semiconductor substrate to be patterned. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal such as, for example, Al, W, or Cu. The mandrel material layer can be formed, for example, by chemical vapor deposition (CVD) or plasma enhanced chemical vapor deposition (PECVD). Following deposition of the mandrel material layer, the mandrel material layer can be patterned by lithography and etching to form a plurality of mandrel structures (also not shown) on the topmost surface of the semiconductor substrate.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in depositing the spacer material include, for example, CVD, PECVD or atomic layer deposition (ALD). Examples of etching that be used in providing the spacers include any etching process such as, for example, RIE.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying semiconductor substrate. The pattern transfer may be achieved by utilizing at least one etching process. Examples of etching processes that can used to transfer the pattern may include dry etch (i.e., RIE, plasma etching, ion beam etching or laser ablation) and/or wet etch. In one example, the etching process used to transfer the pattern may include one or more RIE steps. Upon completion of the pattern transfer, the SIT process concludes by removing the spacers from the structure. The spacers may be removed by etching or a planarization process.

After forming the semiconductor fin 16, a shallow trench isolation (STI) 14 is formed surrounding a base portion of the semiconductor fin 16. The STI 14 may include a dielectric oxide such as, for example, silicon dioxide. The STI 14 may be formed by depositing a dielectric material over the semiconductor substrate portion 10 and the semiconductor fin 16 using a conventional deposition technique, such as, for example, CVD or PVD, planarizing the deposited dielectric material by a conventional planarization technique such as, for example, chemical mechanical planarization (CMP), and then etching back the deposited dielectric material to the desired thickness. In some embodiments, the planarization step may be omitted. An anisotropic etch such as, for example, RIE may be employed to remove the dielectric material of the STI 14 selective to the semiconductor material of the semiconductor fin 16.

Still referring to FIGS. 2A-2B, the gate structures 20 are formed over the semiconductor fin 16. Each gate structure 20 includes a gate stack straddling a channel region 16C (i.e., the active fin region) of the semiconductor fin 16, and a gate spacer 28 present on sidewalls of each gate stack. By "straddling" it is meant that each gate stack is in direct contact with a top surface and two vertical sidewalls of the semiconductor fin. Each gate stack may include, from bottom to top, a gate dielectric 22, a gate electrode 24 and a gate cap 26 and may be formed via any known process in the art, including a gate-first process and a gate-last process.

In a gate-first process, the gate stack (22, 24, 26) can be formed by providing a material stack (not shown) that includes, from bottom to top, a gate dielectric layer, a gate electrode layer and a gate cap layer over the semiconductor fin 16, the STI 14 and the semiconductor substrate portion 10 and lithographically patterning the material stack.

The gate dielectric layer may include any suitable insulating material including, but not limited to, oxides, nitrides or oxynitrides. In one embodiment, the gate dielectric layer may include a high-k dielectric having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k dielectric can be formed. The gate dielectric layer can be formed by any deposition technique including, for example, CVD, PECVD, PVD or atomic layer deposition (ALD). Alternatively, the gate dielectric layer can also be formed by a thermal growth process such as, for example, oxidation, nitridation or oxynitridation to convert surface portions of the semiconductor fin 16 into a dielectric material. The gate dielectric layer that is formed can have a thickness ranging from 0.5 nm to 10 nm, with a thickness from 0.5 nm to about 3 nm being more typical.

The gate electrode layer may include any conductive material including, for example, doped polysilicon, an elemental metal such as W, Ti, Ta, Al, Ni, Ru, Pd and Pt, an alloy of at least two elemental metals, a metal nitride such as WN and TiN, a metal silicide such as WSi, NiSi, and TiSi or multilayered combinations thereof. The gate electrode layer can be formed utilizing a deposition process including, for example, CVD, PECVD, PVD or ALD. In embodiments in which polysilicon or SiGe are used as the gate electrode material, an in-situ deposition process can be used or alternatively deposition followed by ion implantation can be used. The gate electrode layer that is formed can have a thickness ranging from 50 nm to 200 nm, although lesser or greater thicknesses can also be employed.

The gate cap layer may include a dielectric oxide, a dielectric nitride or a dielectric oxynitride. In one embodiment of the present application, the gate cap layer includes silicon nitride. The gate cap layer can be formed by a deposition process including, for example, CVD, PECVD, PVD or ALD. The gate cap layer that is formed can have a thickness ranging from 25 nm to 100 nm, although lesser or greater thicknesses can also be employed.

The lithographic patterning of the material stack can be performed by an anisotropic etch, which can be a dry etch such as, for example, RIE or a wet etch. Each remaining portion of the gate dielectric layer constitutes a gate dielectric 22, each remaining portion of the gate electrode layer constitutes a gate electrode 24, and each remaining portion of the gate cap layer constitutes a gate cap 26.

In a gate-last process, the gate stack (22, 24, 26) may include a sacrificial gate (now shown) that may be later removed and replaced by a gate dielectric and a gate electrode such as those of the gate-first process described above. In an exemplary embodiment, the sacrificial gate may be made of polysilicon with a sacrificial dielectric material (e.g., silicon dioxide) formed using deposition techniques known in the art including, for example, ALD, CVD or PVD.

Each gate spacer 28 may include a dielectric material such as, for example, an oxide, a nitride, an oxynitride, or any combination thereof. In one embodiment, each gate spacer 28 is composed of silicon nitride. The gate spacers 28 can be formed by first providing a conformal gate spacer material layer (not shown) on exposed surfaces of the gate stacks (22, 24, 26), the semiconductor fin 16, the STI 14 and the semiconductor substrate 10 and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. The remaining vertical portions of the gate spacer material layer constitute the gate spacers 28. The width of each gate spacer 28, as measured at the base of the gate spacer 28 can be from 5 nm to 100 nm, although lesser and greater widths can also be employed.

Figure 3:
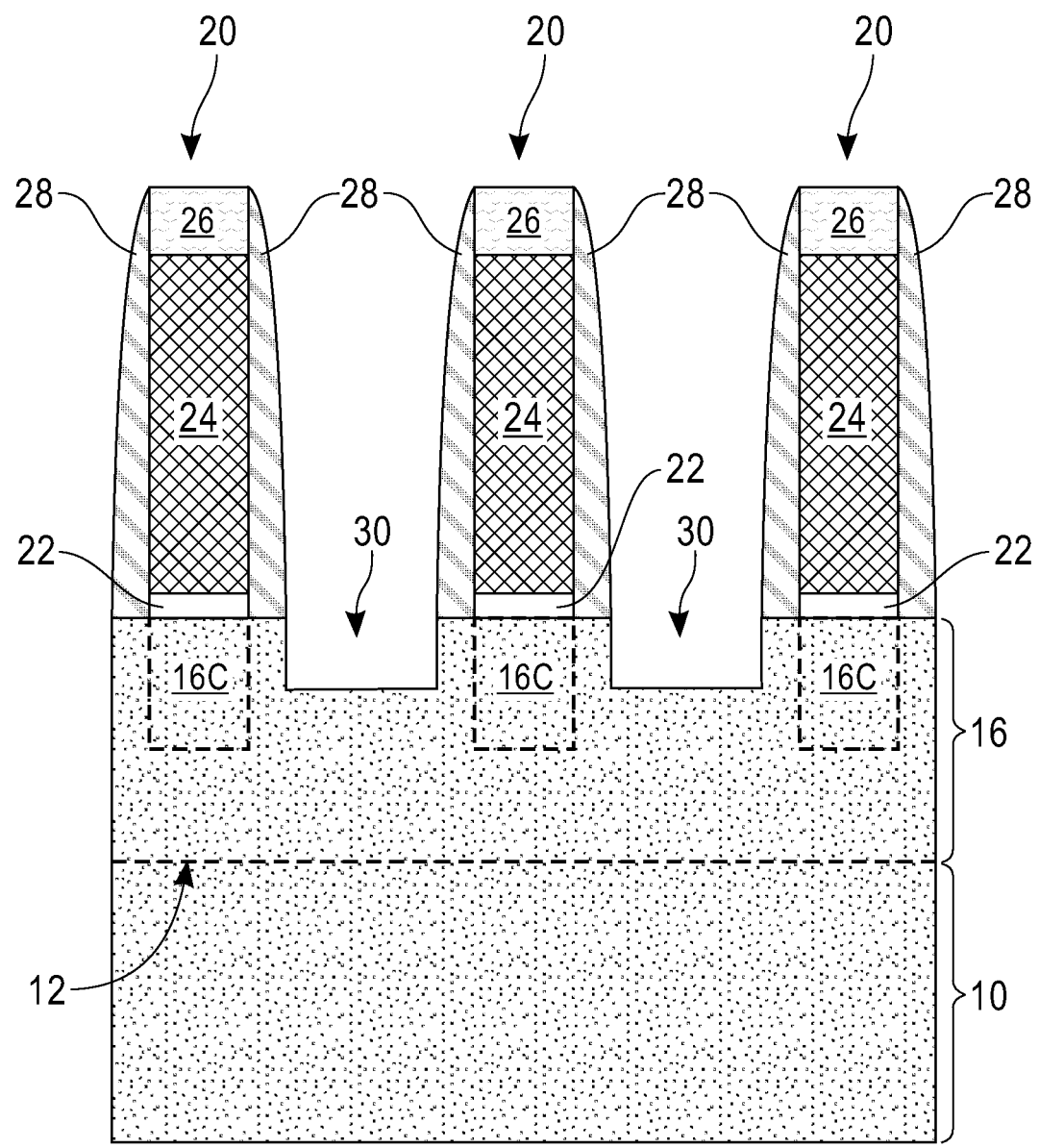
FIG. 3 is a cross-sectional view of the first exemplary semiconductor structure of FIG. 2A after forming first initial cavities within the semiconductor fin on opposites sides of the gate structures.

Referring to FIG. 3, there is illustrated the first exemplary semiconductor structure of FIG. 2A after forming first initial cavities 30 within the semiconductor fin 16 on opposites sides of the gate structures 20. The first initial cavities 30 may have a rectangular shape with substantially vertical sidewalls. The sidewalls of the first initial cavities 30 are vertically coincident with (i.e., vertically aligned to) outer sidewalls of the gate spacers 28. The first initial cavities 30 may be formed by performing an anisotropic etch that removes portions of the semiconductor fin 16 that are not covered by the gate structures 20. In one embodiment, a RIE process using, for example, chlorine, may be performed. In some embodiments, the first initial cavities 30 may have a depth of about 5 nm to 10 nm, although lesser and greater depths can also be employed.

Figure 4:
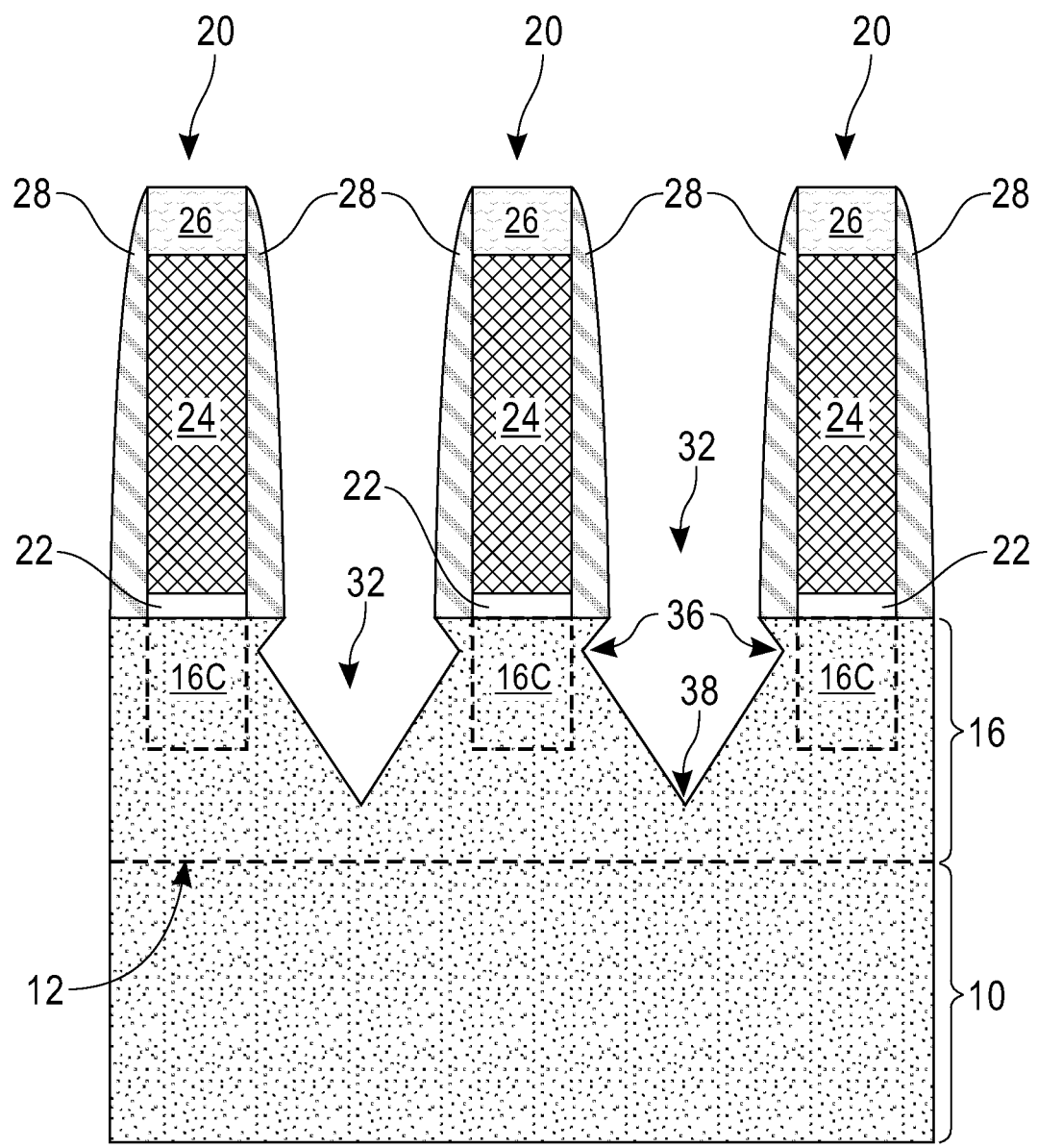
FIG. 4 is a cross-sectional view of the first exemplary semiconductor structure of FIG. 3 after forming first sigma cavities from the first initial cavities.

Referring to FIG. 4, there is illustrated the exemplary semiconductor structure of FIG. 3 after forming first sigma cavities 32 from the first initial cavities 30 by performing a crystallographic anisotropic etch. The crystallographic anisotropic etch is also referred to as a sigma cavity etch. In some embodiments, the sigma cavity etch may comprise a wet etch using, for example, tetramethylammonium hydroxide (TMAH), ammonium hydroxide, and/or potassium hydroxide as an etchant. The etchant etches (001) and (110) crystallographic planes faster than (111) crystallographic planes, forming first sigma cavities 32 with faceted surfaces oriented along (111) planes (herein referred to as (111) faceted surfaces). Each sigma cavity 32 contains a horizontal tip region 36 protruding in a lateral direction towards an adjacent channel region 16C and extending beneath the gate spacer 28. The horizontal tip region 36 comprises an intersection of two faceted surfaces. In one embodiment, the first sigma cavities 32 may be formed to have a V-shaped bottom region 38 as shown in FIG. 4. In another embodiment, the first sigma cavities 32 may be formed to have a bottom region with a substantially flat surface (not shown).

Figure 5:
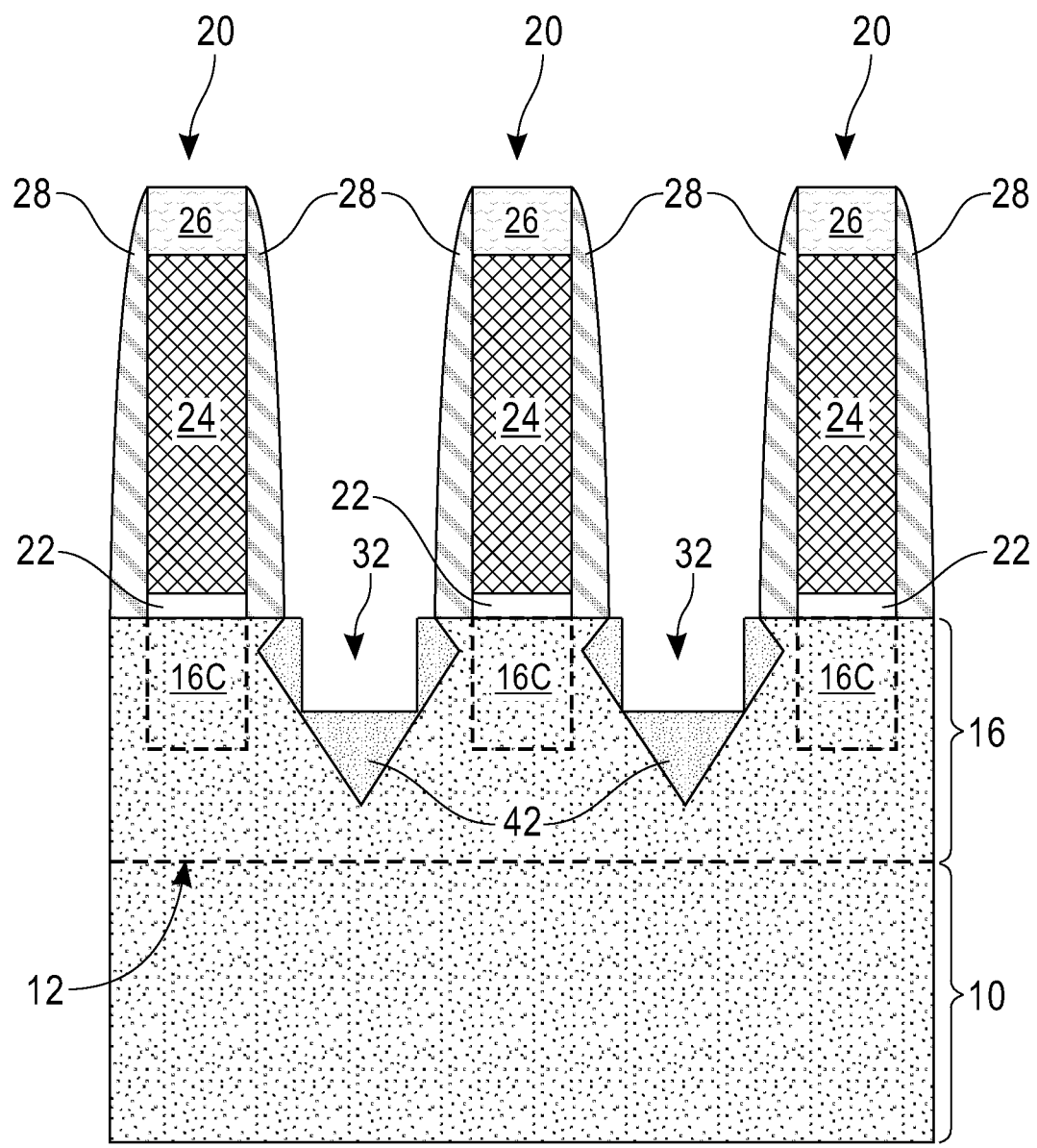
FIG. 5 is a cross-sectional view of the first exemplary semiconductor structure of FIG. 4 after epitaxially growing a semiconductor buffer region from (111) faceted surfaces of each first sigma cavity.

Referring to FIG. 5, there is illustrated the first exemplary semiconductor structure of FIG. 4 after epitaxially growing a semiconductor buffer region 42 from (111) faceted surfaces of each first sigma cavity 32. The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a (111) crystal surface may take on a (111) orientation. In some embodiments, epitaxial growth and/or deposition processes may be selective to forming on semiconductor surfaces, and may not deposit material on dielectric surfaces, such as silicon dioxide or silicon nitride surfaces.

The semiconductor buffer regions 42 may include an intrinsic (i.e., un-doped) semiconductor material that has a larger or smaller lattice constant than that of the semiconductor material that provides the semiconductor fin 16, and thus the semiconductor buffer regions 42 introduces stress to the channel regions 16C of semiconductor fin 16. If the lattice constant of the semiconductor material that provides the semiconductor buffer regions 42 is greater than the lattice constant of the semiconductor material that provides the semiconductor fin 16, a compressive stress can be applied to the channel regions 16C. If the lattice constant of the semiconductor material that provides the semiconductor buffer regions 42 is less than the lattice constant of the semiconductor material that provides the semiconductor fin 16, a tensile stress can be applied to the channel regions 16C. For example, in instances where the semiconductor fin 16 is composed of silicon, for p-type FinFETs, the semiconductor buffer regions 42 may include a SiGe alloy containing, for example, about 10-80 atomic % of germanium to induce a compressive stress towards the channel regions 16C, while for n-type FinFETs, the semiconductor buffer regions 42 may include a Si:C alloy containing, for example, about 0.4-3.0 atomic % of carbon to induce a tensile stress towards the channel regions 16C.

The semiconductor buffer regions 42 may be formed by a first selective epitaxial growth process. The first selective epitaxial growth process deposits the semiconductor material that provides the semiconductor buffer regions 42 only on the semiconductor surfaces (i.e., (111) faceted surfaces), but not on dielectric surfaces, such as gate caps 26, gate spacers 28 and STI 14. In one embodiment, the semiconductor buffer regions 42 are formed, for example, by CVD, molecular beam epitaxy (MBE), metal-organic chemical vapor deposition (MOCVD), or other suitable processes.

Due to the fact that the epitaxial growth rate on (111) planes is considerably less than on (110) and (100) planes (with (100) being the fastest), the deposited semiconductor material grows faster at the horizontal tip region 36 and the bottom region 38 of each first sigma cavity 32 than at sidewall regions having (111) faceted surfaces. The selective epitaxial growth process can proceed such that the horizontal tip region 36 and the bottom region 38 of each first sigma cavity 32 are completely filled by the semiconductor buffer region 42, and a remaining unfilled portion of each first sigma cavity 32 has a box shape with substantially vertical sidewalls. Because the growth at the bottom region 38 of each first sigma cavity 32 is the fastest, a horizontal portion of each semiconductor buffer region 42 has a thickness greater than a thickness of the vertical portion. At this point of the present application and as shown in FIG. 5, a portion of each first sigma cavity 32 remains unfilled after formation of the semiconductor buffer regions 42.

Figure 6:
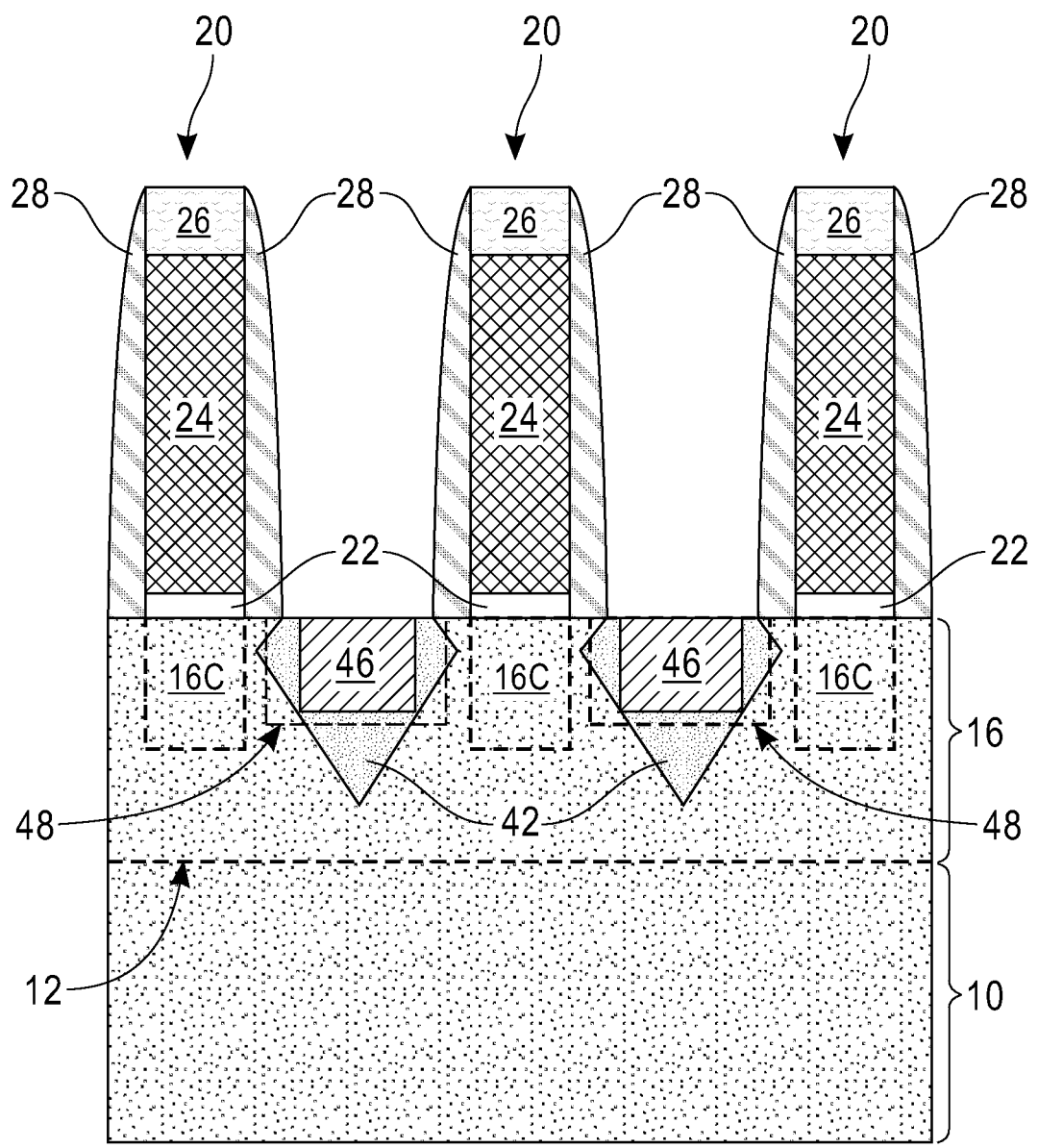
FIG. 6 is a cross-sectional view of the first exemplary semiconductor structure of FIG. 5 after forming a doped semiconductor region on each semiconductor buffer region.

Referring to FIG. 6, there is illustrated the first exemplary semiconductor structure of FIG. 5 after forming a doped semiconductor region 46 on each semiconductor buffer region 42 to completely fill the remaining unfilled portion of each first sigma cavity 32. Each doped semiconductor region 46 and an underlying semiconductor buffer region 42 constitute a source/drain structure. The doped semiconductor regions 46 may include a semiconductor material that can induce the same type of stress to the channel regions 16C of the semiconductor fin 16 as the underlying semiconductor buffer regions 42. In one embodiment, the doped semiconductor regions 46 may be comprised of the same semiconductor material as the semiconductor buffer regions 42. The doped semiconductor regions 46 also include p-type or n-type dopants. The term "p-type" refers to the addition of impurities to an intrinsic semiconductor that creates deficiencies of valence electrons. Examples of p-type dopants, i.e., impurities, include, but are not limited to, boron, aluminum, gallium, and indium. "N-type" refers to the addition of impurities that contributes free electrons to an intrinsic semiconductor. Examples of n-type dopants, i.e., impurities, include, but are not limited to, antimony, arsenic, and phosphorous. In one embodiment, for p-type FinFETs, the doped semiconductor regions 46 may be composed of boron doped SiGe, while for n-type FinFETs, the doped source/drain regions 46 may be composed phosphorous doped Si:C. The dopant centration of the doped semiconductor regions 46 can be from $1.0 \times 10^{20}$ atoms/cm$^3$ to $3.0 \times 10^{21}$ atoms/cm$^3$, although lesser and greater atomic concentrations can also be employed.

The doped semiconductor regions 46 may be formed by a second selective epitaxial growth process. The second selective epitaxial growth process deposits a doped semiconductor material that by in-situ doping, and is herein referred to as an in-situ doped selective epitaxial growth process.

After providing the doped semiconductor regions 46, the dopants in the doped semiconductor regions 46 may be activated by a thermal annealing. Thermal annealing can be performed by a rapid thermal anneal process, a laser anneal process or a furnace anneal process. During the annealing process, the dopants contained within the doped semiconductor regions 46 diffuse into the semiconductor buffer regions 42 and the semiconductor fin 16, thereby forming source/drain junctions 48 between the doped semiconductor regions 46 and the channel regions 16C. In the present application, since the doped semiconductor regions 46 have substantially vertical sidewalls, after annealing, uniform source/drain junctions 48 along the fin height direction are formed between the channel regions 16C and the doped semiconductor regions 46. The undesirable gate length variation encountered in the prior art can thus be resolved.

Figure 7:
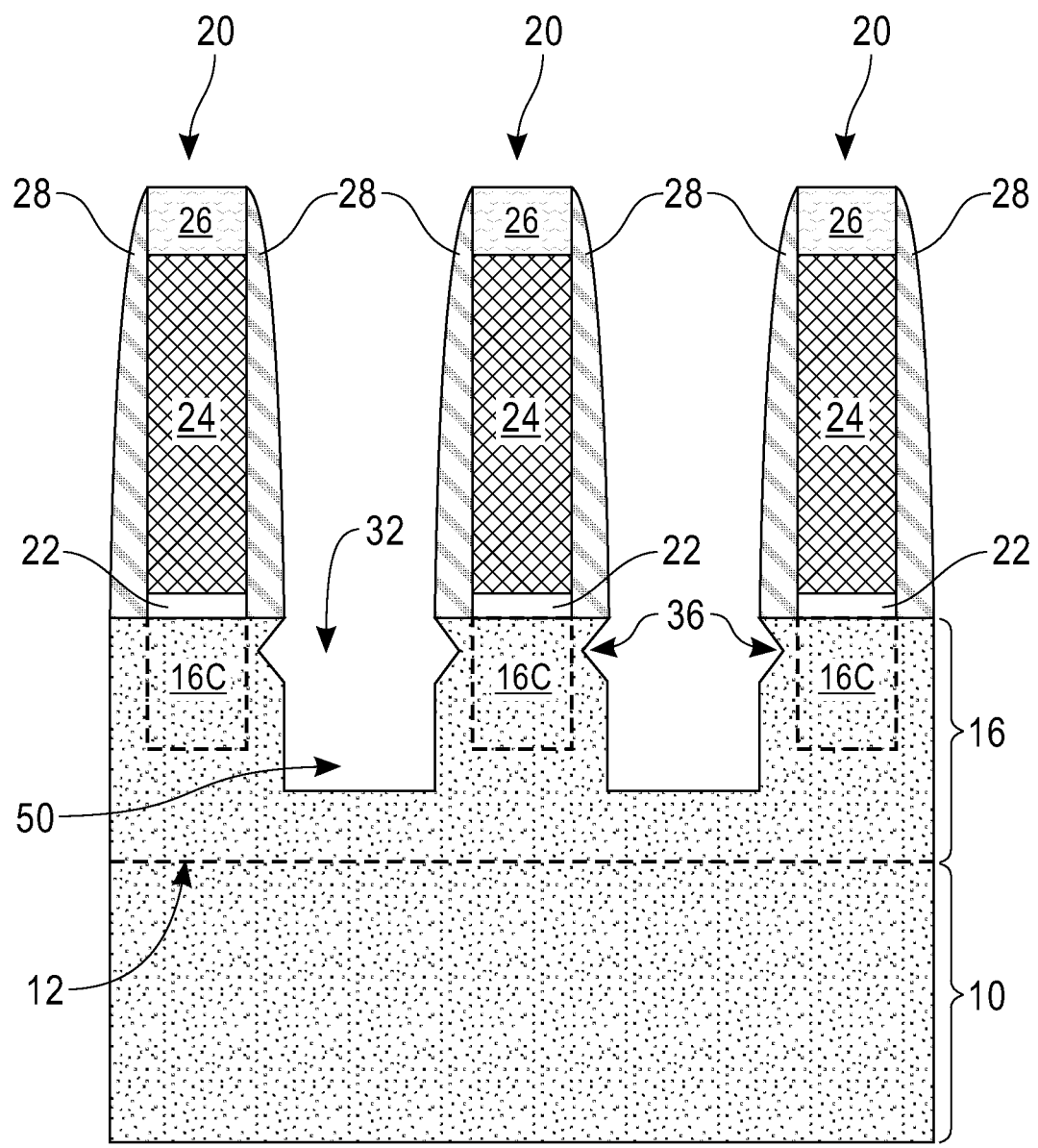
FIG. 7 is a cross-sectional view of a second exemplary semiconductor structure according to a second embodiment of the present application that can be derived from the first exemplary semiconductor structure of FIG. 4 after forming a second initial cavity intersecting a bottom region of each first sigma cavity.

Referring to FIG. 7, there is illustrated a second exemplary semiconductor structure according to a second embodiment of the present application that can be derived from the first exemplary semiconductor structure of FIG. 4 after forming a second initial cavity 50 intersecting a bottom region 38 of each first sigma cavity 32. The second initial cavities 50 have substantial vertical sidewalls that are vertically coincident with (i.e., vertically aligned to) outer sidewalls of gate spacer 28. The second initial cavities 50 can be formed by performing an anisotropic dry etch described above in FIG. 3 for formation of first initial cavities 30.

Figure 8:
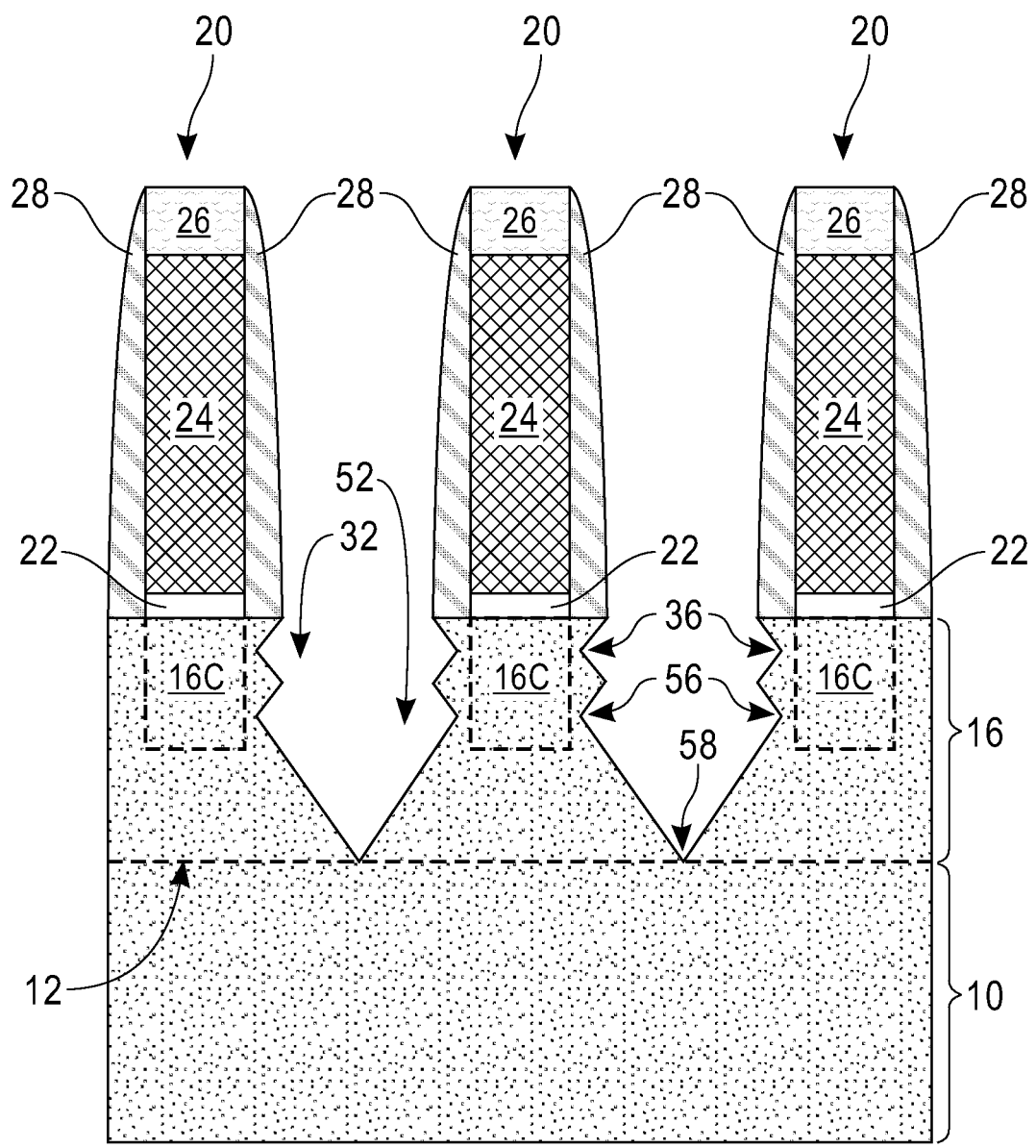
FIG. 8 is a cross-sectional view of the second exemplary semiconductor structure of FIG. 7 after forming a second sigma cavity from each second initial cavity.

Referring to FIG. 8, there is illustrated the second exemplary semiconductor structure of FIG. 7 after forming a second sigma cavity 52 from each second initial cavity 50. The second sigma cavities 52 can be formed by performing the sigma cavity etch described above in FIG. 4 for formation of first sigma cavities 32. Each second sigma cavity 52 intersects the bottom portion 38 of the first sigma cavity 32 and includes a horizontal tip region 56 protruding in the lateral direction and extending beneath the gate spacer 28 and a bottom region 58 extending further towards the semiconductor substrate portion 10 than the first sigma cavity. The horizontal tip region 56 comprises an intersection of two (111) faceted surfaces and is located beneath the horizontal tip region 36 of each first sigma cavity 32. Each first sigma cavity 32 and an underlying second sigma cavity 52 together define a source/drain cavity within which a source/drain structure is subsequently formed.

Figure 9:
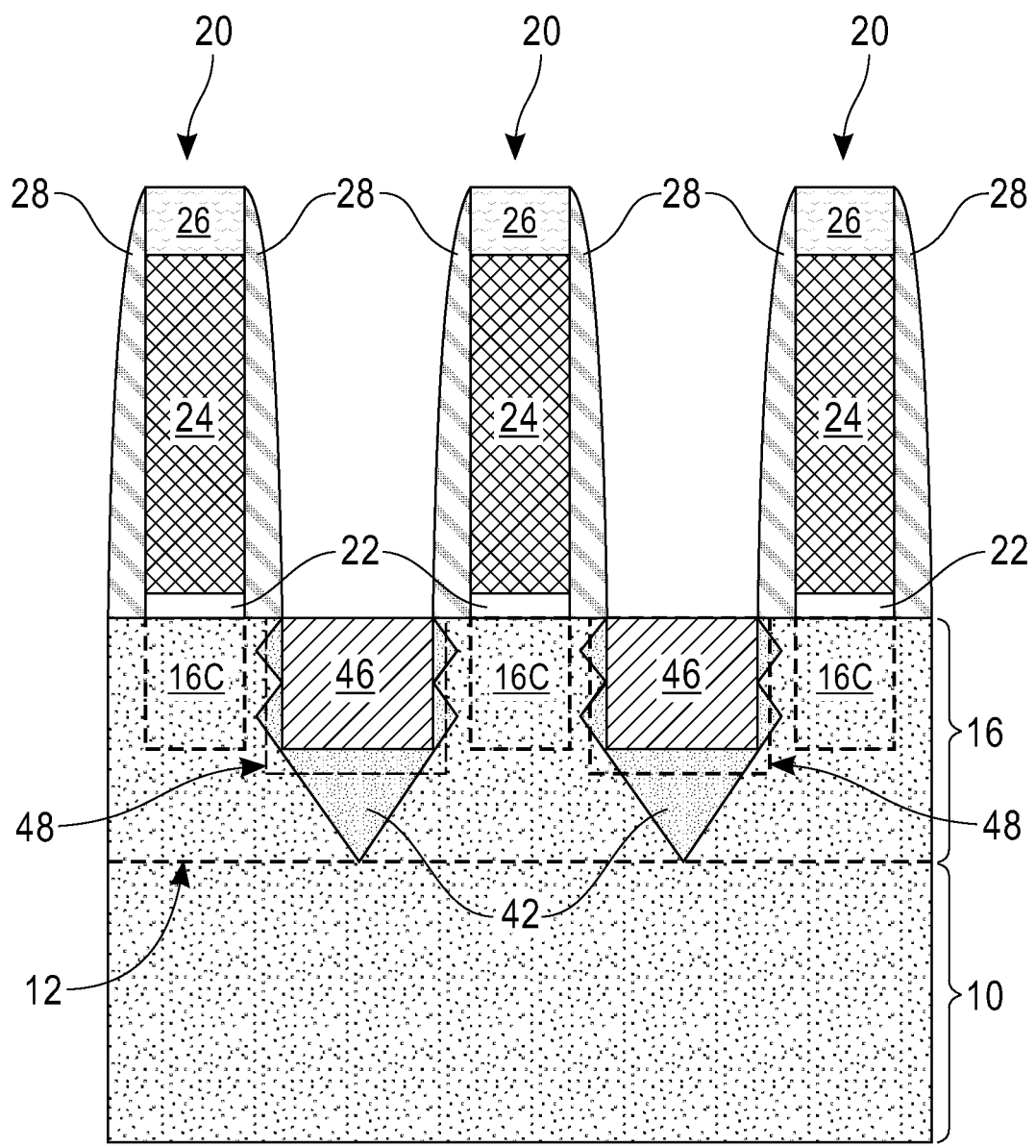
FIG. 9 is a cross-sectional view of the second exemplary semiconductor structure of FIG. 8 after epitaxially growing a semiconductor buffer region from (111) faceted surfaces of each of the first and second sigma cavities and forming a doped semiconductor region on the semiconductor buffer region.

Referring to FIG. 9, there is illustrated the second exemplary semiconductor structure of FIG. 8 after epitaxially growing a semiconductor buffer region 42 from (111) faceted surfaces of each of the first and second sigma cavities 32, 52. The semiconductor buffer region 42 completely fill the horizontal tip region 36 of each first sigma cavity 32, and the horizontal tip region 56 and bottom region 58 of each second sigma cavity 52. The semiconductor buffer region 42 can be formed by performing the processing steps described above in FIG. 5.

Next and as further shown in FIG. 9, a doped semiconductor region 46 is formed on the semiconductor buffer region 42 to fill a remaining portion of each of the first and second sigma cavities 32, 52. The doped semiconductor regions 46 can be formed by performing the processing steps described above in FIG. 6. Each doped semiconductor region 46 has substantially vertical sidewalls. Each doped semiconductor region 46 and an underlying semiconductor buffer region 42 constitute a source/drain structure for a FinFET.

Subsequently, a thermal anneal process described above in FIG. 6 is performed to drive the dopants in the doped semiconductor regions 46 into surrounding semiconductor buffer regions 42 and the semiconductor fin 16, thereby providing uniform source/drain junctions 48 along the fin height direction.

In the second embodiment, by formation an additional sigma cavity (i.e., second sigma cavity 52) intercepting a bottom region 38 of each first sigma cavity 32 to increase the volume of the source/drain cavity, more stress-generating material can be deposited therein so as to create more stress on the channel regions of FinFETs. As a result, operating speed of FinFETs can be further enhanced compared to the first embodiment.

Figure 10:
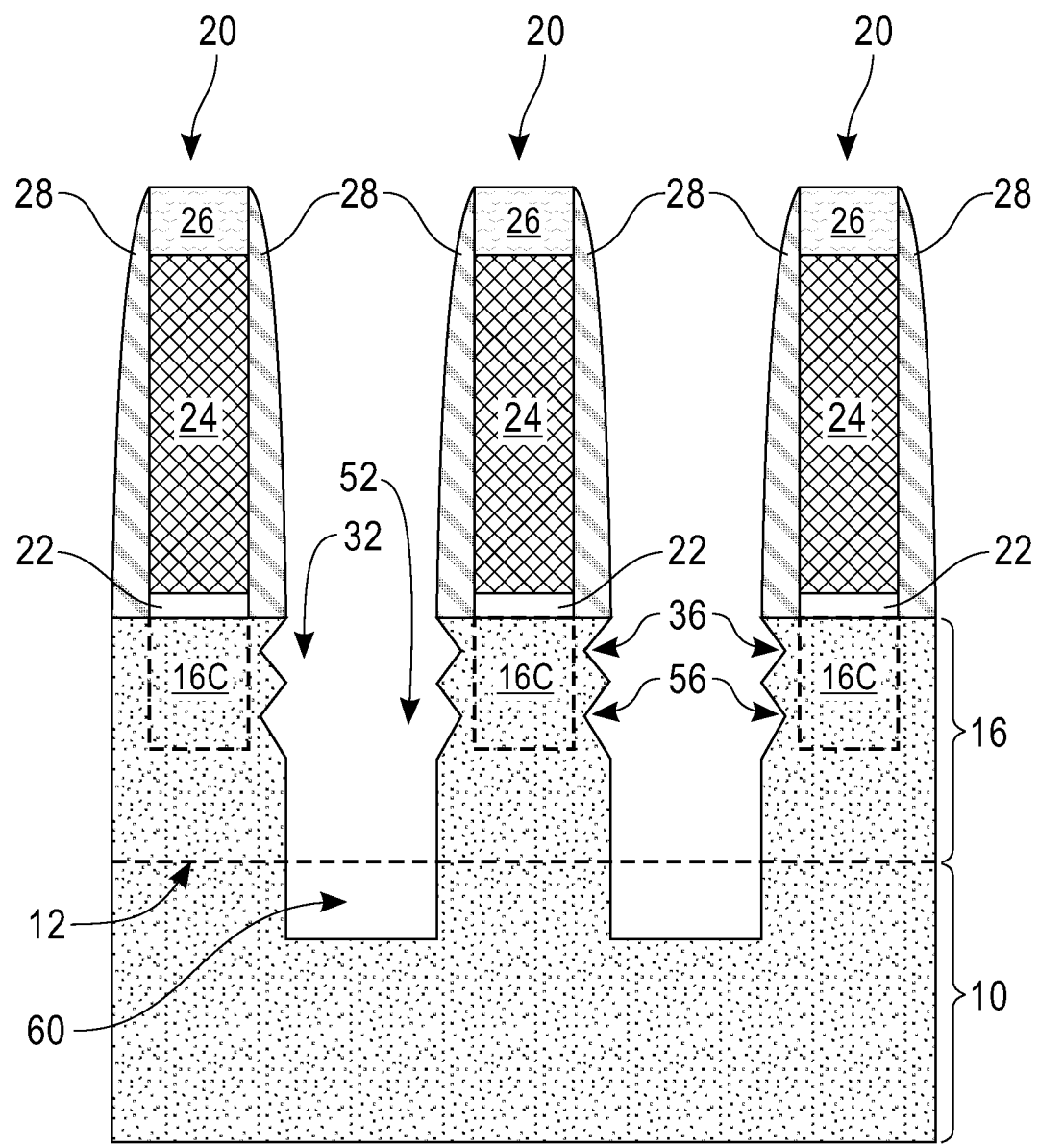
FIG. 10 is a cross-sectional view of a third exemplary semiconductor structure according to a third embodiment of the present application that can be derived from the second exemplary semiconductor structure of FIG. 8 after forming a third initial cavity intersecting a bottom region of each second sigma cavity.

Referring to FIG. 10, there is illustrated a third exemplary semiconductor structure according to a third embodiment of the present application that can be derived from the second exemplary semiconductor structure of FIG. 8 after forming a third initial cavity 60 intersecting a bottom region 58 of each second sigma cavity 52. The third initial cavities 60 have substantial vertical sidewalls that are vertically coincident with outer sidewalls of the gate spacers 28. The third initial cavities 60 can be formed by performing an anisotropic etch described above in FIG. 3 for formation of first initial cavities 30. The third initial cavities 60 are formed to have a depth greater than that of the second initial cavities 50. The third initial cavities 60 thus can extend into the semiconductor substrate portion 10 as shown in FIG. 9.

Figure 11:
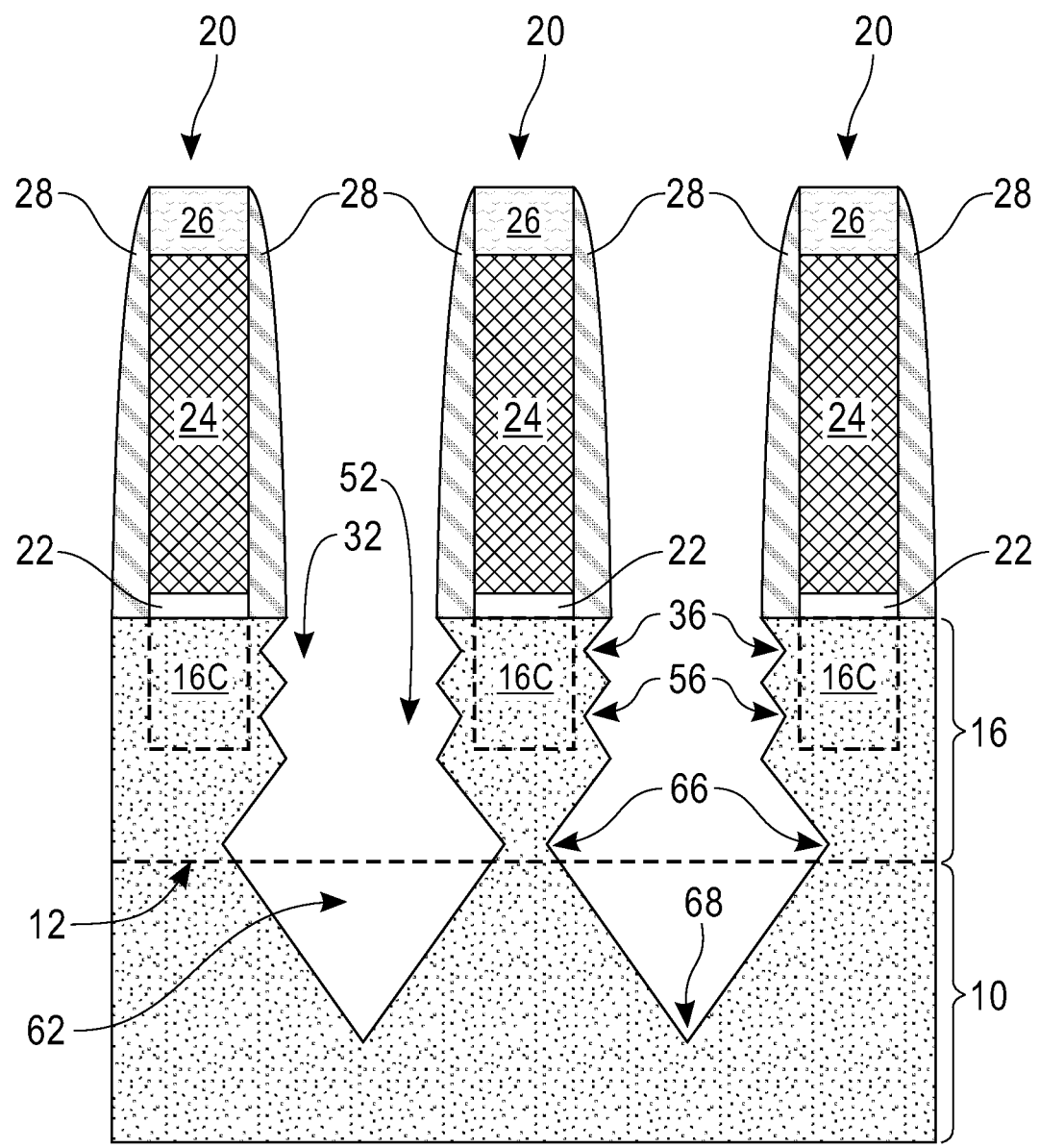
FIG. 11 is a cross-sectional view of the third exemplary semiconductor structure of FIG. 10 after forming a third sigma cavity from each third initial cavity.

Referring to FIG. 11, there is illustrated the third exemplary semiconductor structure of FIG. 10 after forming a third sigma cavity 62 from each third initial cavity 60. The third sigma cavities 62 can be formed by performing the sigma cavity etch described above in FIG. 4 for formation of first sigma cavities 32. Each third sigma cavity 62 includes a horizontal tip region 66 protruding in the lateral direction and a bottom region 68. The horizontal tip region 66 comprises an intersection of two (111) faceted surfaces and is located beneath the horizontal tip region 56 of each second sigma cavity 52. The third horizontal tip region 66 of the third sigma cavities 62 is formed to have a tip depth greater than the height of the channel regions 16C. Because the horizontal tip region 66 of each third sigma cavity 62 is formed below the active fin region, more lateral etch can be allowed. The horizontal tip region 66 of each third sigma cavity 62 thus extends beneath the gate stack (22, 24, 26) to induce even greater stress on the channel regions 16C of FinFETs than the second embodiment. Each first sigma cavity 32 and underlying second sigma cavity 52 and third sigma cavity 62 together define a source/drain cavity within which a source/drain structure is subsequently formed.

Figure 12:
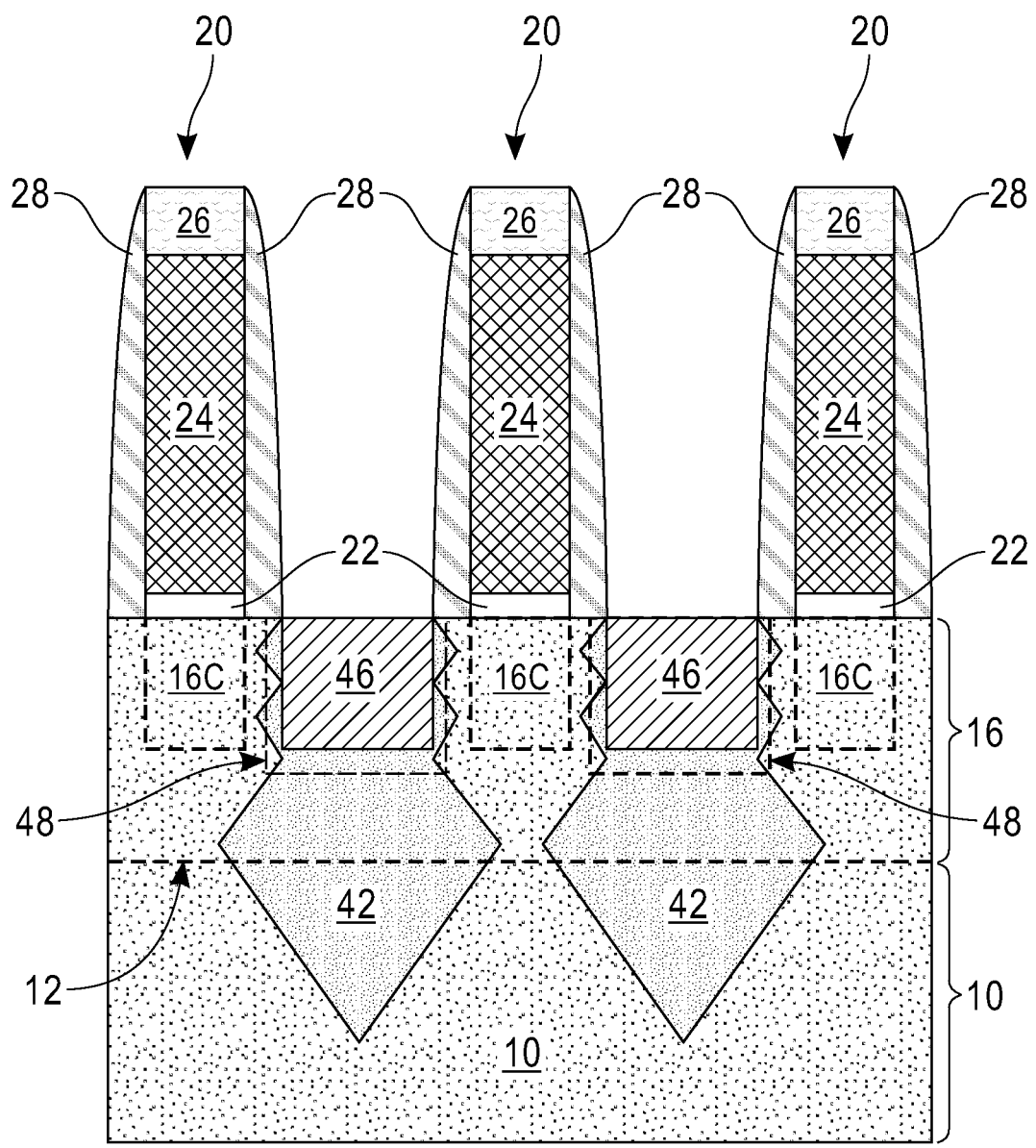
FIG. 12 is a cross-sectional view of the third exemplary semiconductor structure of FIG. 11 after epitaxially growing a semiconductor buffer region from (111) faceted surfaces of each of the first and second sigma cavities and forming a doped semiconductor region on the semiconductor buffer region.

Referring to FIG. 12, there is illustrated the third exemplary semiconductor structure of FIG. 11 after epitaxially growing a semiconductor buffer region 42 from (111) faceted surfaces of each of the first, second and third sigma cavities 32, 52, 62. The semiconductor buffer region 42 completely fill the horizontal tip region 36 of each first sigma cavity 32, the horizontal tip region 56 of each second sigma cavity 52 and each third sigma cavity 62. The semiconductor buffer region 42 can be formed by performing the processing steps described above in FIG. 5.

Next and as is further shown in FIG. 12, a doped semiconductor region 46 is formed on the semiconductor buffer region 42 to fill a remaining portion of each of the first and second sigma cavities 32, 52. The doped semiconductor regions 46 can be formed by performing the processing steps described above in FIG. 6. Each doped semiconductor region 46 has substantially vertical sidewalls. Each doped semiconductor region 46 and an underlying semiconductor buffer region 42 constitute a source/drain structure for a FinFET.

Subsequently, a thermal anneal process described above in FIG. 6 is performed to drive the dopants in the doped semiconductor regions 46 into surrounding semiconductor buffer regions 42 and the semiconductor fin 16, thereby providing uniform source/drain junctions 48 along the fin height direction.

In the third embodiment, by formation a third sigma cavity beneath each second sigma cavity 52 to further increase the volume of each source/drain cavity, more stress-generating material can be deposited therein so as to create more stress on the channel regions of FinFETs compared to the second embodiment. As a result, operating speed of the FinFETs can be greatly enhanced.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A method of forming a semiconductor structure comprising:
forming a gate structure over a semiconductor fin that extends upwards from a semiconductor substrate portion, wherein the gate structure comprises a gate stack straddling a channel portion of the semiconductor fin and a gate spacer present on sidewalls of the gate stack;
forming a sigma cavity within the semiconductor fin on each side of the gate structure, wherein the sigma cavity comprises a horizontal tip region extending beneath the gate spacer and a V-shaped bottom region extending towards the semiconductor substrate portion;
epitaxially growing a semiconductor buffer region from faceted surfaces of the sigma cavity, wherein the semiconductor buffer region completely fills the horizontal tip region and the V-shaped bottom region of the sigma cavity, wherein an unfilled portion of the sigma cavity has substantially vertical sidewalls; and
epitaxially growing a doped semiconductor region from the semiconductor buffer region, wherein the doped semiconductor region completely fills the unfilled portion of the sigma cavity and has substantially vertical sidewalls.

2. The method of claim 1, wherein the forming the sigma cavity comprises:
forming an initial cavity by performing an anisotropic etch to remove a portion of semiconductor fin located on each side of the gate structure, wherein the initial cavity has a sidewall vertically coincident with an outer sidewall of the gate spacer; and
forming the sigma cavity from the initial cavity by performing a wet etch, wherein the sigma cavity is formed having the faceted surfaces oriented along (111) planes.

3. The method of claim 2, wherein anisotropic etch comprises a reactive ion etch.

4. The method of claim 2, wherein the wet etch comprises an etchant including tetramethylammonium hydroxide (TMAH), ammonium hydroxide, or potassium hydroxide.

5. The method of claim 1, wherein the semiconductor buffer region comprises an un-doped stress-generating semiconductor material, and the doped semiconductor region comprises a doped stress-generating semiconductor material.

6. The method of claim 5, wherein the stress-generating semiconductor material induces a compressive stress or a tensile stress to the channel region of the semiconductor fin.

7. The method of claim 1, wherein the semiconductor buffer region is formed by a selective epitaxial growth process, and the doped semiconductor region is formed by an in-situ doped selective epitaxial growth process.

8. The method of claim 1, wherein a horizontal portion of the semiconductor buffer region has a thickness greater than a thickness of each vertical portion of the semiconductor buffer region.

9. The method of claim 1, further comprising activating the dopants present in the doped semiconductor region, wherein the activating causes diffusion of the dopants from the doped semiconductor region through the semiconductor buffer region and formation of a source/drain junction between the doped semiconductor region and the channel portion of the semiconductor fin.

10. The method of claim 9, wherein the source/drain junction has substantially vertical sidewalls.

11. A method of forming a semiconductor structure comprising:
- forming a gate structure over a semiconductor fin that extends upwards from a semiconductor substrate portion, wherein the gate structure comprises a gate stack straddling a channel portion of the semiconductor fin and a gate spacer present on sidewalls of the gate stack;
- forming a sigma cavity within the semiconductor fin on each side of the gate structure, wherein the sigma cavity comprises a horizontal tip region extending beneath the gate spacer and a bottom region extending towards the semiconductor substrate portion;
- epitaxially growing a semiconductor buffer region from faceted surfaces of the sigma cavity, wherein the semiconductor buffer region completely fills the horizontal tip region and the bottom region of the sigma cavity, wherein an unfilled portion of the sigma cavity has substantially vertical sidewalls;
- epitaxially growing a doped semiconductor region from the semiconductor buffer region, wherein the doped semiconductor region completely fills the unfilled portion of the sigma cavity and has substantially vertical sidewalls; and
- forming a source/drain junction having substantially vertical sidewalls between the doped semiconductor region and the channel portion of the semiconductor fin, wherein the forming the source/drain junction comprises activating the dopants present in the doped semiconductor region, wherein the activating causes diffusion of the dopants from the doped semiconductor region through the semiconductor buffer region.

* * * * *